INDIUM OXIDE RESISTOR COMPOSITION, METHOD, AND ARTICLE

Filed June 29, 1964 2 Sheets-Sheet 1

INVENTORS
MURRY L. BLOCK
ARTHUR H. MONES

BY George O. Saile
ATTORNEY

Nov. 19, 1968 M. L. BLOCK ETAL 3,411,947

INDIUM OXIDE RESISTOR COMPOSITION, METHOD, AND ARTICLE

Filed June 29, 1964 2 Sheets-Sheet 2

United States Patent Office 3,411,947

Patented Nov. 19, 1968

3,411,947

INDIUM OXIDE RESISTOR COMPOSITION, METHOD, AND ARTICLE

Murry L. Block and Arthur H. Mones, Poughkeepsie, N.Y., assignors to International Business Machines Corporation, New York, N.Y., a corporation of New York Filed June 29, 1964, Ser. No. 378,921
10 Claims. (Cl. 117—215)

ABSTRACT OF THE DISCLOSURE

A resistor comprises: 100 to 30% by weight of finely divided indium oxide having a crystallite size of between 200 and 2,000 angstrom units; 0 to 60% by weight of borosilicate glass; and, 0 to 70% by weight of dopant capable of altering resistance. Resistivity decreasing dopants are antimony, arsenic, phosphorous, tungsten, silicon, tantalum, zirconium, titanium, tin, cerium, niobium and molybdenum. Resistivity increasing dopants are copper, gold, lead, silver, platinum, palladium and lithium. The borosilicate glass increases resistivity of the indium oxide whether or not doped, and increases adhesion to the surface of a supporting dielectric substrate.

This invention relates to resistors, and more particularly to a resistor element useful in microminiaturized circuits and to methods for forming the resistor elements on the microminiaturized circuit substrate.

The microminiaturized circuit module is typically a one-half inch square substrate of only a fraction of an inch in thickness, having functional components on its surface electrically connected with printed wiring. The functional components are devices which include one or more active or passive electric circuit elements fabricated as an integrated structure and capable of performing useful functions or operations. Passive devices, such as resistors, are preferably applied to the substrate by printing techniques and fired thereon to produce an electrical resistor.

It is thus an object of this invention to provide an electrical resistor which is usable as a discrete resistor component or as a part of a microminiature circuit.

It is an object of this invention to provide an electrical resistor element which is easily appliable to and fired on a dielectric substrate.

It is another object of this invention to provide an electrical resistor element composed of a composition which may be altered to provide a wide range of resistivities together with excellent stability and reproducibility throughout the resistivity range.

It is a further object of this invention to provide an electrical resistor element composed of indium oxide which may be readily altered by the addition of certain critical materials to provide a wide range of resistivities without detrimental effects to the stability, as expressed by the temperature coefficient of resistance (TCR), and drift of the element.

It is a still further object of this invention to provide a method for forming electrical resistor elements composed of an indium oxide modified composition which is readily adaptable to mass production techniques.

These and other objects are accomplished in accordance with the broad aspects of the present invention by providing a resistor composition which is readily adapted to be deposited and fired on a ceramic dielectric to form a highly stable and reproducible electric resistor element thereon. The electrical resistor is composed of high purity indium oxide having a crystallite size of between 200 and 2000 angstrom units. The resistivity and properties of the indium oxide is modified by addition of dopants and borosilicate glass to produce a wide range of resistivities. The resistivities of the electrical resistor element may be readily reproduced. The temperature coefficient of resistance (TCR) values can be made favorable by controlling the compositional parameters in the desired resistor range.

The resistor element is formed on a ceramic dielectric by first producing a homogeneous paste by mixing with a suitable inert liquid vehicle an indium oxide powder having a crystallite size of between about 200 and 2000 angstrom units which may or may not have been modified with a dopant or a combination of dopants and a borosilicate glass. The indium oxide, dopant and glass are dry mixed until a completely homogeneous mixture is produced. An inert liquid vehicle is then mixed with the solid constituents until a homogeneous paste is formed. The paste is then applied to the ceramic dielectric substrate in the desired resistor pattern by conventional coating or silk screening techniques. The applied paste on the ceramic substrate is fired at an elevated temperature above approximately 800° C. to form the electrical resistor element pattern. The element pattern on the substrate is then allowed to cool to room temperature.

The foregoing and other objects, features and advantages of the invention will be apparent from the following more particular description of the preferred embodiments of the invention as illustrated in the accompanying drawings.

Figure 5:
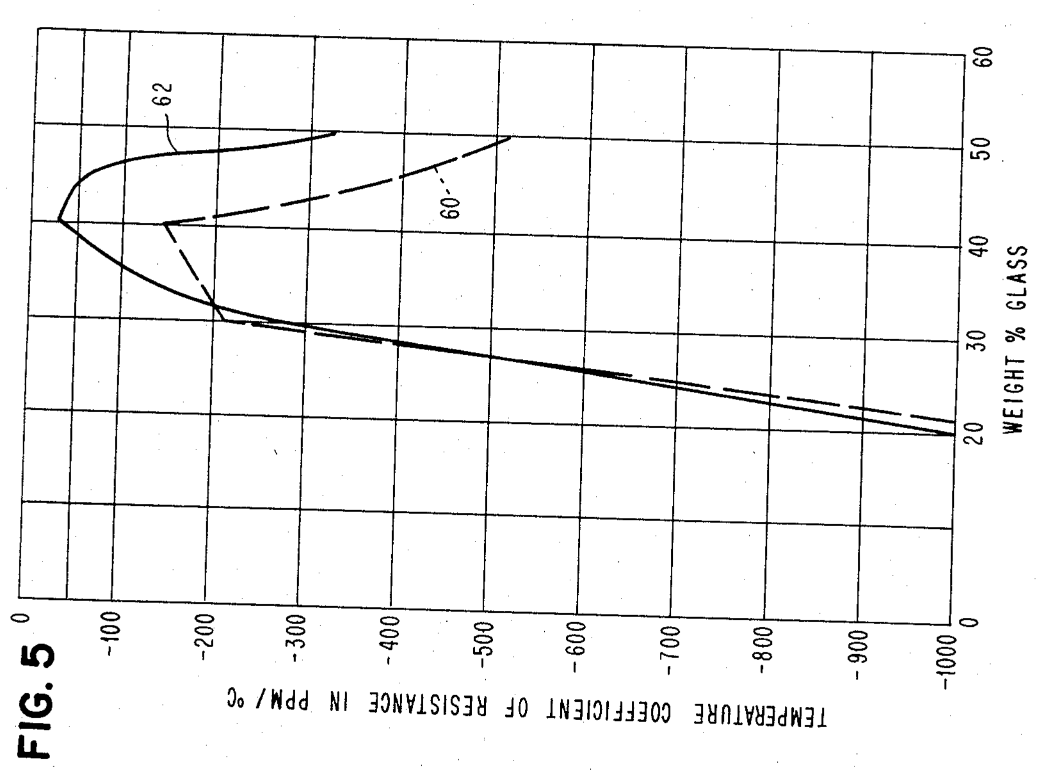
Figure 4:
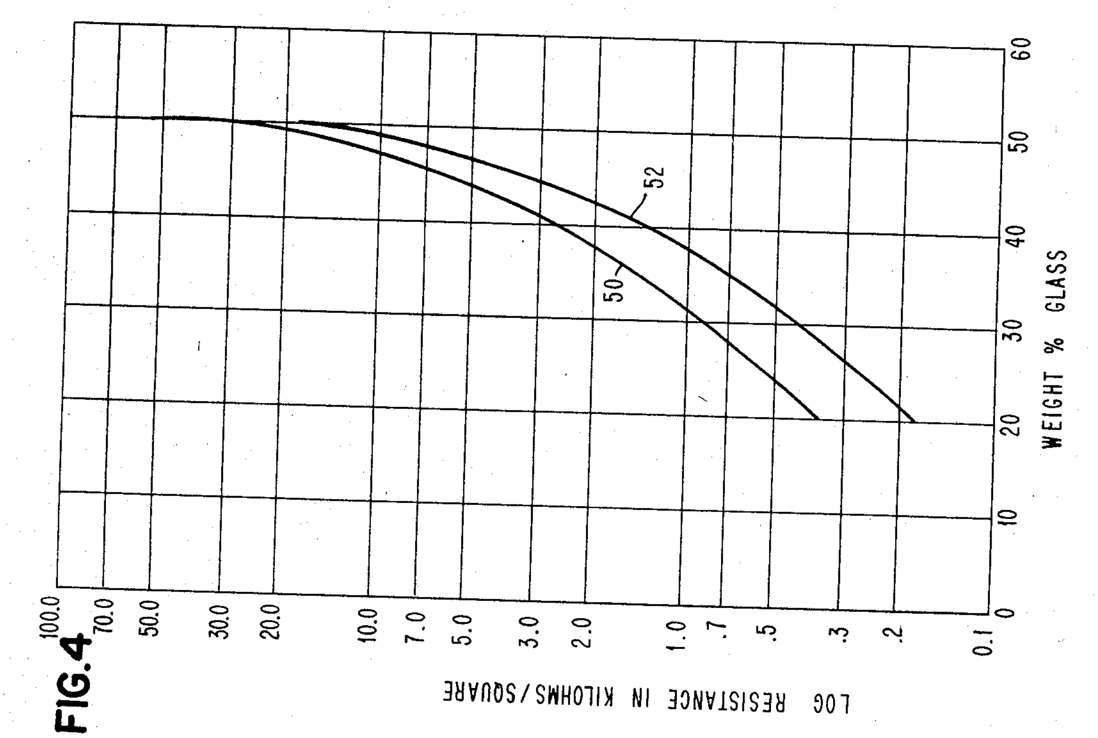

FIGURE 4 gives semilogarithmic graphical representations of the change of resistance with variation of glass content in two indium oxide resistor elements doped with antimony pentaoxide systems; and FIGURE 5 is a graphical representation showing the effect of a variation of the glass content on the TCR of an antimony pentaoxide doped indium oxide resistor element.

Figure 1:
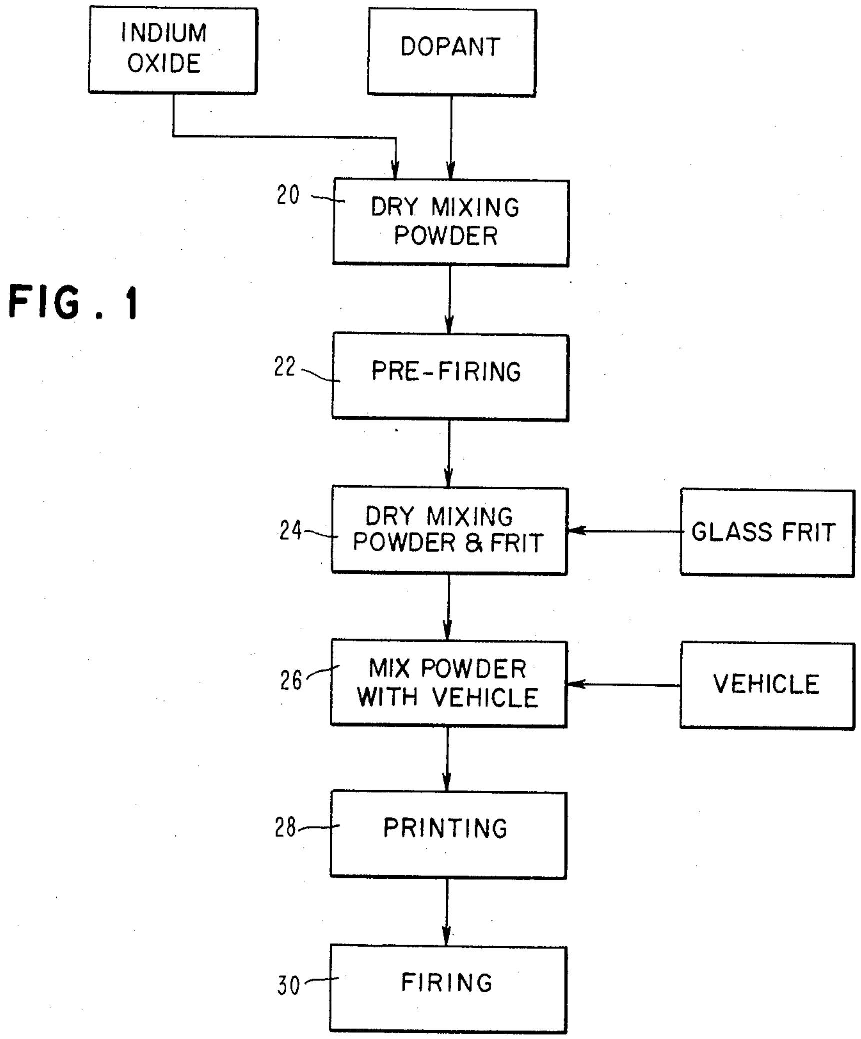
FIGURE 1 is a flow diagram illustrating the method required for fabricating the electrical resistor element of the present invention.
Figure 2:
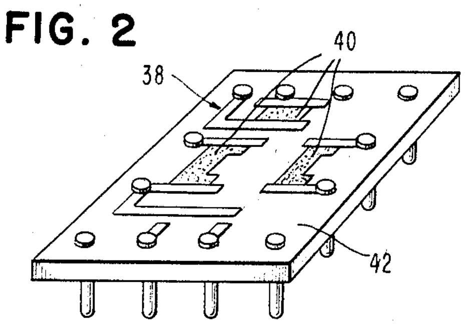
FIGURE 2 is a perspective illustration of a resistor pattern on a ceramic substrate.
Figure 3:
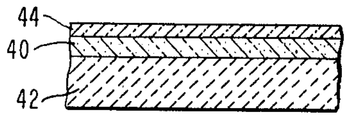
FIGURE 3 is a cross sectional illustration of the electrical resistor of the present invention.

Referring now, more particularly, to the flow diagram of FIGURE 1, there is given a summary of the method of fabricating the resistor element pattern shown in perspective in FIGURE 2 and in cross section in FIGURE 3. High purity indium oxide and the quantity of dopant or combination of dopants required for the desired electrical resistor resistivity are carefully weighed. The indium oxide and dopant materials are mixed in step 20 in a suitable mixing device such as an electric mortar until the materials are uniformly mixed. This mixture may then be prefired as step 22 at an elevated temperature. If it is desired to have glass in the resistor composition, a suitable borosilicate glass frit, preferably having a softening point above about 750° C., is placed in a non-contaminating container with the indium oxide and dopant mixture, and the materials are uniformly mixed as given in step 24 by means of a mechanical shaker shaking the container. The prefiring step improves the doping in the final resistor element. The prefiring step, however, is not necessarily required. As a further alternate the indium oxide, dopant and glass may be dry mixed in one step.

The uniformly mixed powders and glass frit are now ready to be mixed with the vehicle. The vehicle may be any suitable inert liquid. It would normally include a resinous binder, a solvent for the binder and a surfactant. The binder material is used to retain the powders and glass frit on the substrate when the solvent has been removed. Examples of binders include natural gums, synthetic resins, cellulose resinous materials and the like. The solvent imparts the desired viscosity to the printing paste. Commonly used solvents are the higher boiling paraffins, cycloparaffins and aromatic hydrocarbons or mixtures thereof; or one or more of the mono- and di-alkyl ethers of diethylene glycol or their derivatives such as diethylene glycol monobutyl ether acetate. A suitable surfactant or dispersing agent is used to allow a better dispersion of the indium oxide, dopant and glass frit in the paste. Typical of such materials are organic derivatives such as polyoxyethylene alcohol non-ionic surfactants. The elements of the vehicle are premixed into solution before mixing in the step 26.

The premixed indium oxide, dopant and borosilicate glass frit are combined with the inert vehicle and are thoroughly and homogeneously mixed until a paste of the desired viscosity is formed in the method step 26. Standard mixing apparatuses may be used such as a mortar and pestle, a blade type mixer or the like, to initially mix the materials. There is no need for attrition. It is then preferable, but not absolutely necessary to further mix the ingredients on a mill. A three roll mill is preferably used to further disperse the indium oxide, dopant and borosilicate glass frit in the vehicle. The mill temperature should not be allowed to rise much above room temperature to avoid excess volatilization of the vehicle. The paste is removed from the mill and is now ready for application to the substrate.

The ceramic dielectric substrate preferably has a suitable electrode or conductive element pattern 38 already applied to it. One suitable conductive element composition and method for applying the composition is a silver-palladium alloy disclosed in patent application Ser. No. 370,467, filed May 27, 1964, and assigned to the same assignee as the present invention, now U.S. Patent No. 3,374,110 issued Mar. 19, 1968. The resistor pattern is then printed thereover. Alternatively, the resistor pattern may be printed on a substrate without electrodes, and the electrodes may be printed over the resistor pattern. The substrate is, of course, thoroughly cleaned and free from grease or other extraneous material before the printing step 28 is attempted. A silk screen having the desired resistor pattern is placed over the clean substrate. The paste is squeegeed, doctored or extruded onto the screen. Pressure is applied to spread the paste through the screen and onto the substrate. The pattern on the screen is reproduced at a thickness determined by a number of variables, for example, squeegee pressure and angle, paste viscosity, screen openings, and emulsion thickness. The screen is removed from the substrate and the printed resistor pattern 40 is ready to be dried and fired.

The firing step 30 includes a cycle of heating, firing and cooling. The period during which the temperature of the printed paste on the substrate is gradually being increased to that of the actual firing temperature is called the heating period. It is during the heating period that the solvent of the paste evaporates. The binder constituent is decomposed as the temperature increases and approaches the firing temperature and the binder is substantially removed from the paste as gaseous combustion products. The indium oxide, dopant and borosilicate glass frit, where present, fuse at the firing temperatures to produce a durable fired resistor pattern 40 on the dielectric substrate 42. The dielectric substrate having the fused pattern of a resistor thereon is then brought to room temperature. The resistors may be fired in the air or in an inert atmosphere at temperatures from 800° to 1200° C. However, the preferred firing temperature range is from 900° to 1000° C. The time of maintaining the resistor composition at firing temperature must be longer where lower firing temperatures are used. The longer firing times improve the stability characteristics of the fired resistor elements. At firing temperatures of 950° C. or higher, ten minutes at firing temperature has proved satisfactory. The firing step is preferably accomplished in an inert atmosphere where low resistivities are required. It has been found that by firing under a substantially inert atmosphere a resistance can be very significantly lowered.

After the resistor elements are secured to the dielectric substrate as described above, the functional components such as transistors, diodes and the like are secured in their proper locations on the dielectric substrate. The methods for accomplishing the securing of these active functional components onto the substrate are more fully described in the patent application Ser. No. 300, 855, and now Patent No. 3,292,240, filed Aug. 8, 1963, and patent application Ser. No. 300,734, filed Aug. 8, 1963, both of which are assigned to the assignee of the present invention.

The purity of the indium oxide in the resistor composition must be not less than 99.9 percent. For optimum resistor results a purity of 99.99 or higher is indicated. The requirement of purity is necessary because the variation in trace element impurities in the indium oxide will make the use of indium oxide unpredictable as a resistor. The crystallite size of the indium oxide particles is an important parameter. The crystallite size as determined from X-ray line broadening must be between about 200 and 2000 angstrom units. The preferable range of crystallite size under present firing conditions is from 300 to 1250 angstrom units. When the crystallite size of the indium oxide is below about 200 angstroms the TCR becomes too negative and there are discontinuities in the resistor element. Alternatively, when the crystallite size is increased to a value over about 2000 angstroms the TCR becomes too positive and the resistance approaches impractically high values. The crystallite size determination uses a diffractometer technique with a standard crystal of over 1000 angstrom units in crystallite size for correcting instrument broadening. The line width due to small crystallite size is evaluated according to the Scherrer formula. The crystallite size determination technique and theory therefor is more fully described in "X-Ray Diffraction Procedures" by Klug and Alexander, published by John Wiley & Co., New York, 1954, chapter 9, pp. 491–538.

The resistivity of the resistor can be varied by the amount of dopant and/or the amount of borosilicate glass incorporated into the indium oxide resistor. The dopants used for the indium oxide resistor system may either raise or lower the resistivity of the system. A dopant may be used singly or in combination with one or more dopants to produce desired resistor element properties. The dopants which have been used to decrease the resistance of the indium oxide resistors are antimony, arsenic, phosphorus, tungsten, silicon, tantalum, zirconium, titanium, tin, cerium, niobium and molbydenum. The dopants which have been used to increase the resistance of the resistor system are copper, gold, lead, silver, platinum, palladium and lithium. The addition of borosilicate glass acts to increase the resistivity of an indium oxide resistor by dilution whether doped or not. The glass also helps to increase the adhesion of the resistor to the surface of the ceramic dielectric substrate.

The FIGURE 3 shows a glaze layer 44 which can be applied over the resistor 40. The glaze layer is preferably composed of a borosilicate glass. It is between about 0.5 and 2 mils in thickness. Overglazing is accomplished by dispersing the borosilicate glass frit in a suitable inert vehicle, to form a paste, coating the resistors with the paste such as by silk screening techniques, drying the solvent from the coating and firing. The overglazing operation can be associated with a one or two step firing procedure, that is, the glaze may be applied to a fired or unfired resistor and subsequently fired. The one step firing procedure is preferred for economy reasons. The glaze is used because it affords additional mechanical and environmental protection.

The three components, indium oxide dopants and borosilicate glass, of the resistor composition of the present invention may be varied to produce a wide range of resistance values. The over-all operative and preferred composition ranges are, as expressed in weight percent:

| | Operative | Preferred |
|---|---|---|
| Indium oxide ($In_2O_3$) | 100 to 30 | 90 to 35. |
| Dopant | 0 to 70 | 0.2 to 37. |
| Borosilicate Glass | 0 to 60 | Low Resistance 0 to 20.<br>Middle Resistance 40 to 50.<br>High Resistance 45 to 55. |

The addition of dopant above the about 70 percent by weight level produces resistor elements having unacceptable electrical characteristics such as excess thermal drift, change in power factor and undesirable TCR values. The addition of glass to the indium oxide resistor elements of greater than about 60 percent by weight produces resistance values that are too high for general use. The indium oxide resistor elements made within the preferred ranges have good electrical stability characteristics.

The FIGURES 4 and 5 show how typical indium oxide resistor compositions may be varied to obtain desired resistance values together with good electrical stability characteristics. The FIGURE 4 curve 50 shows the effect of glass content in the resistor element on the resistance where a constant ratio of indium oxide ($In_2O_3$) to antimony pentaoxide ($Sb_2O_5$) of 85.80 is used. The curve 52 shows a similar resistance variation with glass content where an indium oxide to antimony pentaoxide ratio of 42.91 is used. It is readily observed from FIGURE 4 that increased glass content increases the resistance of the indium oxide resistor elements. Also, by comparing curves 50 and 52, it is seen that greater concentration of antimony pentaoxide produces lower resistance indium oxide resistors. FIGURE 5 compares the important temperature coefficient of resistance (TCR) characteristic for identical compositions of FIGURE 4. The curves 60 and 62 correspond to the weight ratios, respectively, of curves 50 and 52 in FIGURE 4. It is seen from curves 60 and 62 that glass concentrations in the range of about 25 to 50 percent by weight produce indium oxide resistor elements having excellent TCR values. Further, that in this doping range, the higher doped resistor composition as represented by curve 62 has an even better TCR than that of the composition represented by curve 60.

The following examples are included merely to aid in the understanding of the invention, and variations may be made by one skilled in the art without departing from the spirit of the invention.

EXAMPLES 1 THROUGH 7

Indium oxide having a purity of 99.999 percent and a crystallite size of between 600 and 800 angstrom units was mixed with antimony pentaoxide for a series of antimony pentaoxide modified indium oxide compositions. The precise composition of the resistors made in each example is given in Table I.

TABLE I

| Example | $In_2O_3$, Weight Percent | $Sb_2O_5$, Weight Percent | Resistance in kilohms/ square | TCR, p.p.m./° C. |
|---|---|---|---|---|
| 1 | 97.6 | 2.4 | 0.5 | −1,300 |
| 2 | 94.6 | 5.4 | 0.08 | −4,000 |
| 3 | 89.4 | 10.6 | 0.017 | −500 |
| 4 | 81.1 | 18.9 | 0.011 | −250 |
| 5 | 63.2 | 27.8 | 0.012 | −240 |
| 6 | 45.5 | 54.5 | 0.070 | −400 |
| 7 | 30.0 | 70.0 | 0.85 | −1,300 |

The indium oxide and the antimony pentaoxide dopant were individually weighed out and placed in their respective container for each example. Each of the formulations were dry mixed using an electric mortar for 30 minutes.

A vehicle for the resistor paste was made up of the following constituents given in parts by weight:

| | |
|---|---|
| High boiling petroleum distillate mixture of aromatic aliphatic components (Amsco HCC) | 57 |
| Polystyrene resin (Piccolastic D100) | 37 |
| Alkylphenoxypoly (ethyleneoxy) ethanol surfactant (Igepal CO430) | 6 |

These ingredients were agitated in a closed high kinetic energy disperser until all of the polystyrene resin was dissolved.

The premixed indium oxide and antimony pentaoxide for each example were combined with the vehicle and individually mixed using an electric mortar for 15 minutes until completely wetted. The following were the parts by weight solid constituent and liquid constituent used for each example:

| | Percent |
|---|---|
| Solids constituent | 75 |
| Vehicle | 25 |

In each case the wetted material was taken from the mortar and further individually mixed on a three roll mill to further disperse the indium oxide and antimony pentaoxide in the vehicle. The printing paste was removed from the mill and mixed with a spatula to insure uniformity.

Ceramic dielectric substrates composed of 95 percent alumina and having a suitable electrode pattern of silver-palladium electrode material of the composition and applied by the method disclosed in the above mentioned patent application, Ser. No. 370,467, filed May 27, 1964 were provided. The substrates were thoroughly cleaned by immersion in ultrasonically agitated trichloroethylene for ten minutes.

The paste for each of the examples was applied to their respective ceramic substrates through a silk screen having a 105 mesh size by means of a squeegee. The squeegee was urged against the screen to spread the paste through the screen and onto the substrate to take the pattern of the screen. The screens were removed and the substrate for each example was fired in an oven at 950° C. The heating-firing-cooling cycle used was 5–10–5 minutes.

A series of standard tests was performed on the resistor elements of each of the examples. Each example was given tests for determining the resistance per square and the temperature coefficient of resistance (TCR) for the respective resistor element composition. The results of the tests tabulated in Table I show that low resistance range indium oxide resistors can be satisfactorily made by doping with antimony pentaoxide. The resistance of the resistor element increased with antimony content.

EXAMPLES 8 THROUGH 12

A series of samples was made up using combinations of antimony pentaoxide, indium oxide and glass frit. The particular glass used as given in parts by weight was the following barium aluminum borosilicate glass:

| | Parts by weight |
|---|---|
| Aluminum oxide ($Al_2O_3$) | 9.5 |
| Silicon dioxide ($SiO_2$) | 49.4 |
| Boron trioxide ($B_2O_3$) | 10.4 |
| Barium oxide (BaO) | 30.3 |
| Other non-alkali oxides | 0.4 |

The procedure of Examples 1 through 7 was used except that an additional dry mixing step was made wherein the antimony and indium oxides were dry mixed with the borosilicate glass frit in a non-contaminating polyethylene jar. The mixture was shaken on a mechanical mixer for a period of one hour. The composition of the samples that were made up and tested is given in the Table II as Examples 8 through 12. The percent by weight of the glass component of the compositions was varied within each of the examples.

TABLE II

| Ex. | Weight, percent | | | Glaze | Resistance in kilohms/sq. | TCR in p.p.m./° C. | Power, 85 watts/in.² in 24 hr. periods | Power Testing change in Resistance (percent) | Storage, percent change in Resistance at 150° C. | Storage Time, hrs. |
|---|---|---|---|---|---|---|---|---|---|---|
| | $Sb_2O_5$ | $In_2O_3$ | Glass | | | | | | | |
| 8 | 8.5 | 71.5 | 20 | No | 0.13 | −930 | | | | |
| | 8.5 | 71.5 | 20 | Yes | 0.2 | −530 | | | | |
| | 7.4 | 62.6 | 30 | No | 0.35 | −665 | | | | |
| | 7.4 | 62.6 | 30 | Yes | 0.5 | −800 | | | | |
| | 6.4 | 53.6 | 40 | No | 1.3 | −500 | 1 | +.65 | 3.7 | 250 |
| 9 | 17.0 | 73.0 | 10 | No | 0.013 | +135 | | | | |
| | 17.0 | 73.0 | 10 | Yes | 0.016 | +80 | | | | |
| | 14.2 | 60.8 | 25 | No | 0.045 | >−1,300 | | | | |
| | 14.2 | 60.8 | 25 | Yes | 0.045 | −1,050 | | | | |
| | 13.2 | 56.8 | 30 | No | 0.11 | −1,200 | | | | |
| | 13.2 | 56.8 | 30 | Yes | 0.3 | −925 | | | | |
| | 11.3 | 48.7 | 40 | No | 1.5 | −2,700 | | | | |
| 10 | .7 | 59.3 | 40 | No | 2.6 | −150 | 1 | −.57 | −.43 | 1,000 |
| | .6 | 56.4 | 43 | No | 4.5 | −300 | 3 | +.14 | +.26 | 1,000 |
| | .6 | 49.4 | 50 | No | 63.0 | −520 | | | +.14 | 1,000 |
| 11 | 1.9 | 78.1 | 20 | No | 0.18 | −1,050 | | | | |
| | 1.7 | 68.3 | 30 | No | 0.38 | −240 | | | | |
| | 1.4 | 58.6 | 40 | No | 1.5 | −40 | 3 | −.95 | −1.47 | 1,000 |
| | 1.3 | 53.7 | 45 | No | 3.5 | −62 | 5 | −.28 | −.19 | 1,000 |
| | 1.3 | 51.7 | 47 | No | 6.2 | −200 | 5 | +.08 | −.05 | 1,000 |
| | 1.2 | 48.8 | 50 | No | 18.0 | −330 | | | −.02 | 1,000 |
| 12 | 4.3 | 75.7 | 20 | No | 0.2 | >−1,300 | | | | |
| | 3.8 | 66.2 | 30 | No | 0.4 | −465 | | | | |
| | 3.2 | 56.8 | 40 | No | 1.15 | −330 | 1 | −2.2 | −2.19 | 1,000 |
| | 3.0 | 52.0 | 45 | No | 1.5 | −225 | 4 | −1.75 | −1.32 | 500 |
| | 2.9 | 50.1 | 47 | No | 3.8 | −265 | 3 | −.08 | −.08 | 1,000 |
| | 2.7 | 47.3 | 50 | No | 7.3 | −350 | 2 | −.7 | −.13 | 1,000 |
| | 2.4 | 42.6 | 55 | No | 350.0 | −665 | | | | |
| | 2.2 | 37.8 | 60 | No | 7,500.0 | −650 | | | | |

Certain of the examples are indicated as having a glaze over the resistor. The glaze was applied by silk screening using the barium aluminum borosilicate glass composition which was used in the resistor formulation. The resistor coating was allowed to dry for ten minutes at 100° C. prior to the overglazing step. The identical vehicle used for the resistor paste was used for the overglazing paste.

A series of standard tests was performed on the resistor elements made in the examples and the results are given in Table II for these tests. Certain of the examples were given power and storage tests to determine the stabililty of the indium oxide resistors under severe environmental conditions. In the power test the resistor is subjected to a power density of 85 watts per square inch for at least one 24 hour period while the resistor temperature is 150° C. This power density is nine times the rated power density. The result of the power test is given in percent change in resistance. The result of the storage test is given as the percent change in resistance for the given storage time of the resistor element at 150° C. The results of the tests show the increase of resistance possible by borosilicate glass addition and to a lessor extent to the increase in the antimony dopant level. The very acceptable power and storage test results show the stability of the resistor elements even in difficult environments.

EXAMPLE 13

A series of undoped indium oxide and glass resistors were made according to the compositions given in Table III:

TABLE III

| Weight, percent | | Glaze | Resistance in kilohms/square | TCR in p.p.m./° C. | Storage, percent change in Resistance at 150° C. | Storage Time, hrs. |
|---|---|---|---|---|---|---|
| $In_2O_3$ | Glass | | | | | |
| 60 | 40 | No | 28 | >−1,500 | | |
| 100 | | Yes | 3 | >−1,500 | | |
| 50 | 50 | No | 100 | −20 | +.2 | 250 |
| 50 | 50 | Yes | 48 | +100 | +.3 | 500 |
| 40 | 60 | No | 1,300 | | | |
| 30 | 70 | No | >1,000,000 | | | |

These resistors were fabricated according to the Example 1 through 7 procedure. The standard tests were given the resulting resistor elements and the results thereof are shown in Table III. The results show that a wide resistance range of indium oxide resistor elements can be made with the addition of a borosilicate glass without doping.

EXAMPLES 14 THROUGH 18

A series of resistor compositions was made up according to the method of Examples 1 through 7. The compositions of the resistor paste were varied according to the compositions given in Table IV. A companion undoped resistor element was made and processed with each doped resistor element example as given in the Table IV. In this group dopants other than antimony (+5) were used, that is, palladium, gold, silicon, antimony (+3), antimony (+4), chloride, zirconium and niobium.

TABLE IV

| Ex. | Weight percent | | Weight percent Dopant | | Resistance in kilohms/square | TCR in p.p.m./° C. |
|---|---|---|---|---|---|---|
| | $In_2O_3$ | Glass | $Sb_2O_5$ | | | |
| 14 | 48.4 | 40.5 | 1.1 | 10.0 PdO | 8.5 | −2,000 |
| | 53.7 | 45.0 | 1.3 | | 2.2 | −50 |
| 15 | 52.8 | 36.0 | 1.2 | 10.0 Au | 8.0 | −250 |
| | 58.6 | 40.0 | 1.4 | | 1.2 | −100 |
| 16 | 52.9 | 45.0 | 1.2 | 0.9 $SiO_2$ | 1.2 | +300 |
| | 53.7 | 45.0 | 1.3 | | 2.8 | −240 |
| 17 | 58.8 | 40.0 | | 1.2 $Sb_2O_3$ | 2.0 | −900 |
| | 58.6 | 40.0 | | 1.4 $Sb_2O_4$ | 1.8 | −200 |
| | 58.6 | 40.0 | 1.4 | | 1.5 | −40 |
| 18 | 99.2 | | | 0.8 $NH_4Cl$ | .22 | −2,000 |
| | 98.3 | | | 1.7 $ZrO_2$ | 1.2 | −2,000 |
| | 98.2 | | | 1.8 $Nb_2O_5$ | .22 | −2,000 |
| | 100.0 | | | | 3.0 | −2,000 |

The standard tests were applied to the finished resistors and the results thereof are given in the Table IV. It is seen from these examples that a variety of dopants can be used to adjust the resistance of indium oxide resistor elements. The Examples 14, 15 show how dopants can be used to increase the resistance of the indium oxide resistor element. The remaining examples show the reduction of resistance with dopants.

EXAMPLE 19

A series of four samples were made up according to the procedure of Examples 8 through 12 up to the firing step. The resistor composition used in weight percent was 58.6 indium oxide, 1.4 antimony pentaoxide and 40 barium aluminum borosilicate glass. Each of the samples were individually fired in a different atmosphere. The atmosphere for each example is specified in Table V.

The sample to be fired was placed in a quartz washing tube. Air was purged from the tube by flow of the specified gas through the tube. The quartz tube was in turn placed in a furnace. Firing was accomplished in each case using a 5–10–5 minutes heating-firing-cooling cycyle with a firing temperature of 950° C. The specified gas was flowed through the tube at 4 liters per minute during the entire heating-firing-cooling cycle.

The standard tests were given the resulting resistor elements and the results thereof are tabulated in Table V. It is seen that the resistors fired in inert atmospheres B, C and D have substantially lower resistance values than the air fired resistor elements.

TABLE V

| | Environment | Resistance in kilohms/ square | TCR in p.p.m./° C. | Storage, percent change in Resistance at 150° C. |
|---|---|---|---|---|
| A | Air | 1.1 | −550 | +.31 |
| B | Nitrogen | .06 | +900 | +.55 |
| C | 90% helium plus 10% nitrogen | .25 | +700 | +.42 |
| D | Helium | .27 | +700 | +.39 |

While the invention has been particularly shown and described with reference to preferred embodiments thereof, it will be understood by those skilled in the art that the foregoing and other changes in form and details may be made therein without departing from the spirit and scope of the invention.

What is claimed is:

1. A resistor composition adapted to be applied to and fired on a suitable substrate to form an electrical resistor film comprising:

90 to 35 percent by weight of a finely divided, 99.9 percent pure indium oxide having a crystallite size of between about 300 and 1250 angstrom units;

0 to 60 percent by weight of an alkali-free barium aluminum borosilicate glass having a softening point above about 750° C.; and 0.2 to 37 percent by weight of a dopant capable of altering the resistance of said resistor film.

2. The resistor composition of claim 1 wherein said dopant is a material which acts to increase the resistance of said resistor film.

3. The resistor composition of claim 1 wherein said dopant is a material which acts to decrease the resistance of said resistor film.

4. The resistor formed by applying to and then firing on a suitable substrate the resistor composition of claim 1.

5. The resistor as defined in claim 4 wherein the said glass composition is between 0 and 20 percent by weight.

6. The resistor as defined in claim 4 wherein the said glass composition is between 40 and 50 percent by weight.

7. The resistor as defined in claim 4 wherein the said glass composition is between 45 and 55 percent by weight.

8. The resistor according to claim 4 including a protective layer applied to said resistor film.

9. The resistor according to claim 8 wherein said protective layer is a glass.

10. A resistor composition adapted to be applied to and fired on a suitable substrate to form an electrical resistor film comprising:

90 to 35 percent by weight of a finely divided, 99.9 percent pure indium oxide having a crystallite size of between about 300 and 1250 angstrom units;

0 to 60 percent by weight of an alkali-free barium aluminum borosilicate glass having a softening point above about 750° C.; and 0.2 to 37 percent by weight of antimony pentaoxide.

References Cited

UNITED STATES PATENTS

| | | | |
|---|---|---|---|
| 2,572,662 | 10/1951 | Richardson et al. | 252—518 |
| 3,295,002 | 12/1966 | Amans | 313—108 |

WILLIAM L. JARVIS, *Primary Examiner.*